(12) United States Patent
Everett et al.

(10) Patent No.: US 7,293,999 B2
(45) Date of Patent: Nov. 13, 2007

(54) HOUSING OF CIRCUIT BOARDS

(75) Inventors: Keith Everett, Suffolk (GB); Kevin Paul Little, Suffolk (GB); Jamie Anderson, Suffolk (GB)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/479,474

(22) Filed: Jun. 30, 2006

(65) Prior Publication Data

US 2007/0020971 A1 Jan. 25, 2007

(30) Foreign Application Priority Data

Jul. 7, 2005 (GB) ................... 0513956.3

(51) Int. Cl.
*H01R 12/00* (2006.01)
(52) U.S. Cl. .................. 439/76.1; 439/607
(58) Field of Classification Search .......... 439/76.1, 439/607; 361/752, 730, 728, 796, 807
See application file for complete search history.

(56) References Cited

U.S. PATENT DOCUMENTS

| | | | |
|---|---|---|---|
| 6,206,728 B1* | 3/2001 | Krehbiel et al. ............ 439/607 |
| 6,220,873 B1* | 4/2001 | Samela et al. ............. 439/76.1 |
| 6,257,905 B1* | 7/2001 | Johnson ..................... 439/95 |
| 6,524,120 B2* | 2/2003 | Zhao ........................ 439/95 |
| 6,537,085 B2* | 3/2003 | Na ........................ 439/76.1 |
| 6,955,544 B2* | 10/2005 | Miquel et al. ............ 439/76.1 |
| 6,999,323 B1* | 2/2006 | Aronson et al. .......... 361/753 |
| 2004/0198079 A1* | 10/2004 | Aronson et al. ......... 439/76.1 |
| 2006/0002096 A1* | 1/2006 | Wang et al. .............. 361/752 |
| 2006/0030173 A1* | 2/2006 | Kawakita et al. ......... 439/76.1 |

FOREIGN PATENT DOCUMENTS

| | | |
|---|---|---|
| DE | 4000286 | 7/1991 |
| DE | 19620194 | 11/1997 |
| DE | 19721295 | 11/1998 |
| EP | 0098212 | 1/1984 |
| EP | 1357779 | 10/2003 |
| EP | 1411756 | 4/2004 |

* cited by examiner

*Primary Examiner*—Gary Paumen

(57) ABSTRACT

A fiber optic module has a PCB with high frequency tracks. The PCB is housed within a housing having top and bottom parts, each having a series of metallized ridges. The PBC has through holes filled with solder. Thus, there is a series of electrical interconnections through the PBC, and the total length of any enclosed periphery is much shorter than the full periphery of the board so that high frequencies are attenuated.

10 Claims, 8 Drawing Sheets

HOUSING OF CIRCUIT BOARDS

INTRODUCTION

The invention relates to support of circuit boards in a housing, particularly circuit boards having high-frequency tracks.

In devices such as fiber optic transceiver modules there are circuit boards having high frequency tracks. For avoidance of damage to such tracks there is typically a gap or space above and below the board, the board being supported on ledges on opposed sides. While this configuration of housing is effective at reducing risk of physical damage, these spaces unfortunately provide a path for high frequency signals and render the module susceptible to interference. This arises particularly if there is a relatively long periphery around the board.

The invention addresses this problem.

STATEMENTS OF INVENTION

According to the invention, there is provided an electronic device comprising a circuit board having high frequency tracks and a housing surrounding the board, wherein the housing and the board comprise interconnect means for forming connections between opposed parts of the housing through the board.

In one embodiment, the interconnect means comprises conductors extending through the board for contact with the housing on opposed sides of the board.

In another embodiment, the conductors comprise solder filled into board through-holes.

In a further embodiment, the conductors extend above the surface of the board on at least one side.

In one embodiment, the conductors form bumps on both opposed surfaces of the board.

In another embodiment, the housing comprises protruding features to make electrical connections with the conductors.

In a further embodiment, the protruding features are ridge-shaped.

In one embodiment, the board comprises through-holes and the housing comprises teeth extending through the through holes.

In another embodiment, opposed teeth extend partially through the through-holes to make contact.

In a further embodiment, the opposed teeth extend partially through the board.

In one embodiment, the interconnect means comprises a conductive and resilient connector.

In another embodiment, said connector is in the form of a gasket surrounding the board.

DETAILED DESCRIPTION OF THE INVENTION

The invention will be more clearly understood from the following description of some embodiments thereof, given by way of example only with reference to the accompanying drawings in which.

Figure 1:
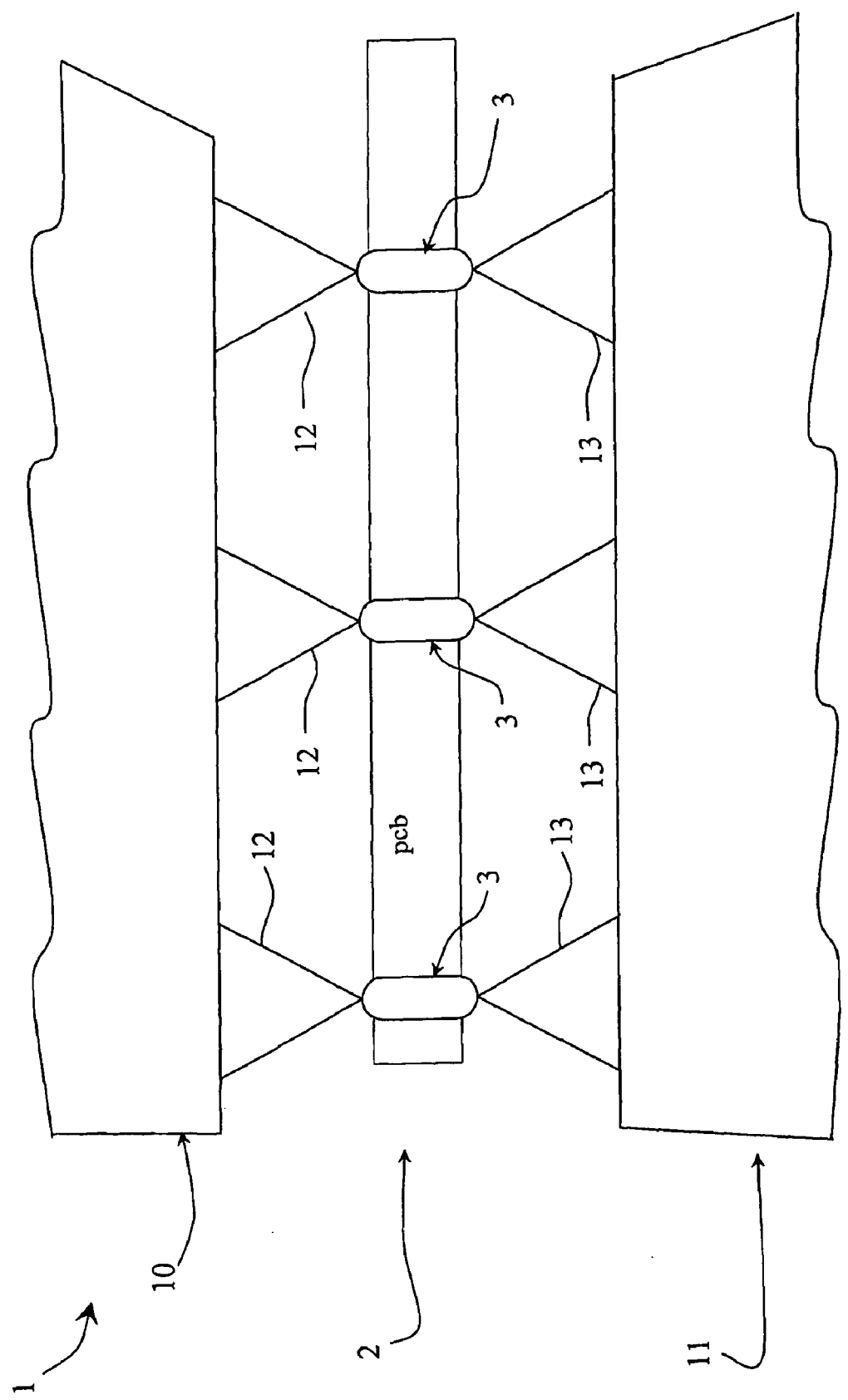
FIG. 1 is a diagrammatic cross-sectional sketch showing a housing and PCB assembly of the invention.
Figure 2:
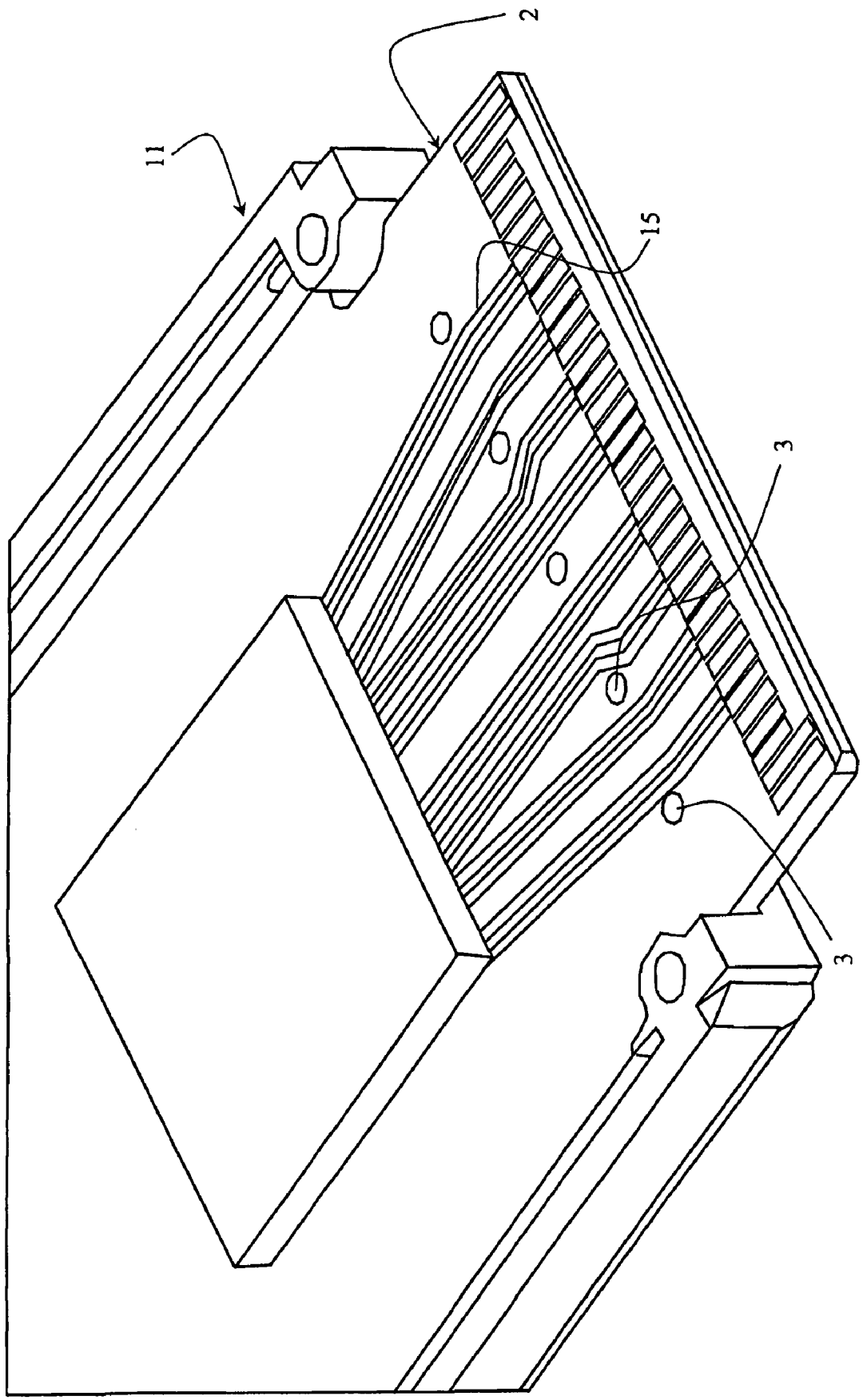
FIG. 2 is a perspective view from above of the assembly with a top housing part removed.
Figure 3:
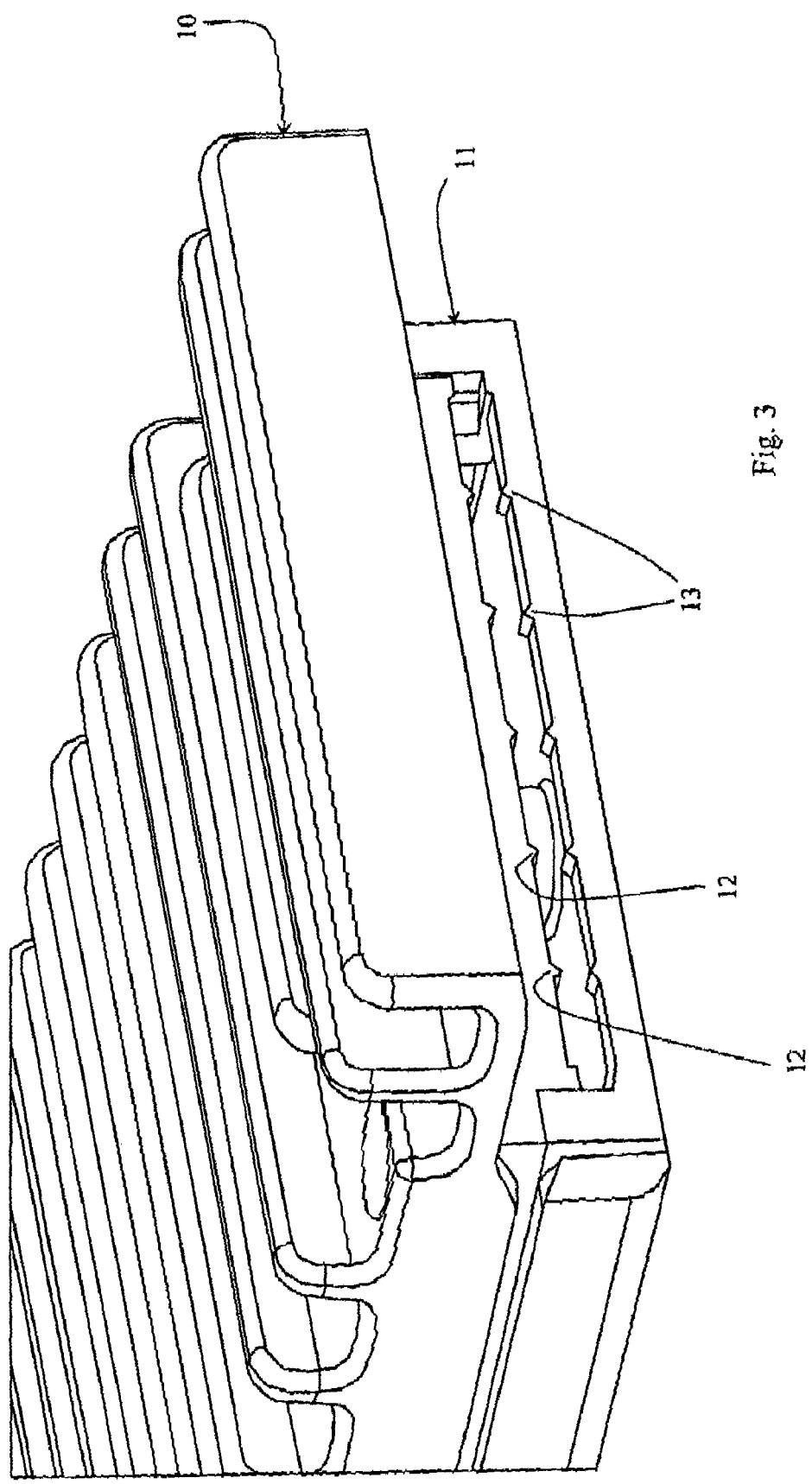
FIG. 3 is a perspective view showing an end of the housing without the board.

Referring to FIG. 1 an opto-electronic device 1 comprises a top housing part 10, a bottom housing part 11, and a PCB 2. The PCB 2 has solder 3 filled into through-holes, providing a bump on each side. The housing parts 10 and 11 have ridges 12 and 13 respectively located to engage the protruding solder bumps of the solder 3. The ridges 12 and 13 are metallized with black electroless nickel so that there is a full electrical connection between the parts 10 and 11 through the solder 3. Also, the solder 3 is isolated from the PCB tracks 15, ensuring that there is no adverse impact on the operation of the PCB's circuit. This is shown clearly in FIG. 2. The configuration of the ridges 12 and 13 is shown more clearly in FIG. 3, triangular in cross-section and being long enough along the apex to ensure good contact with the bump.

Because of the several top-to-bottom interconnections, the total length of any enclosed periphery is much shorter than heretofore. This significantly attenuates high frequencies.

Figure 4:
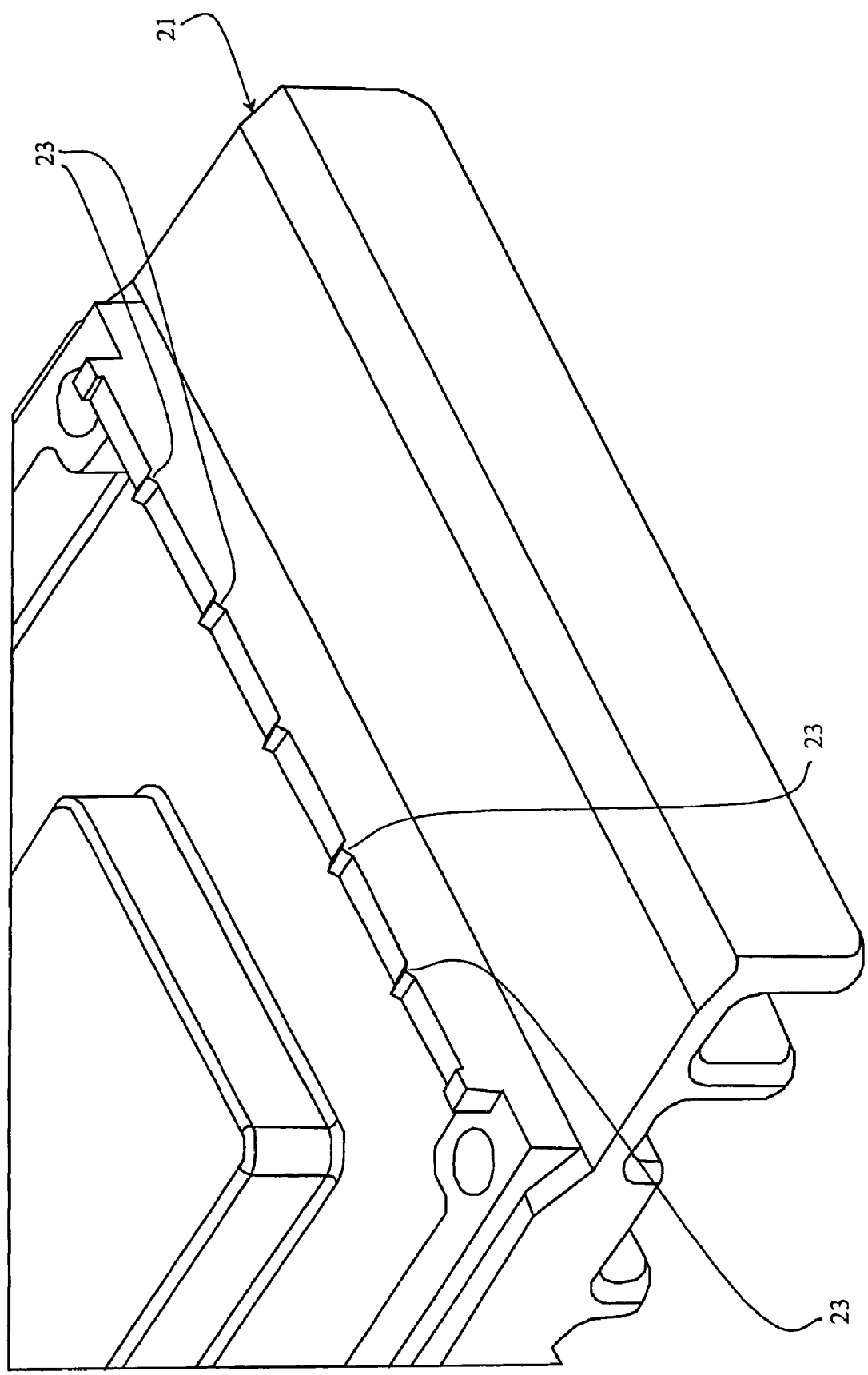
FIGS. 4 and 5 are perspective views from above of alternative housing bottom parts.

An alternative housing bottom part 21 is shown in FIG. 4. This has a stepped configuration, with ridges 23 on an upper tier.

Figure 5:
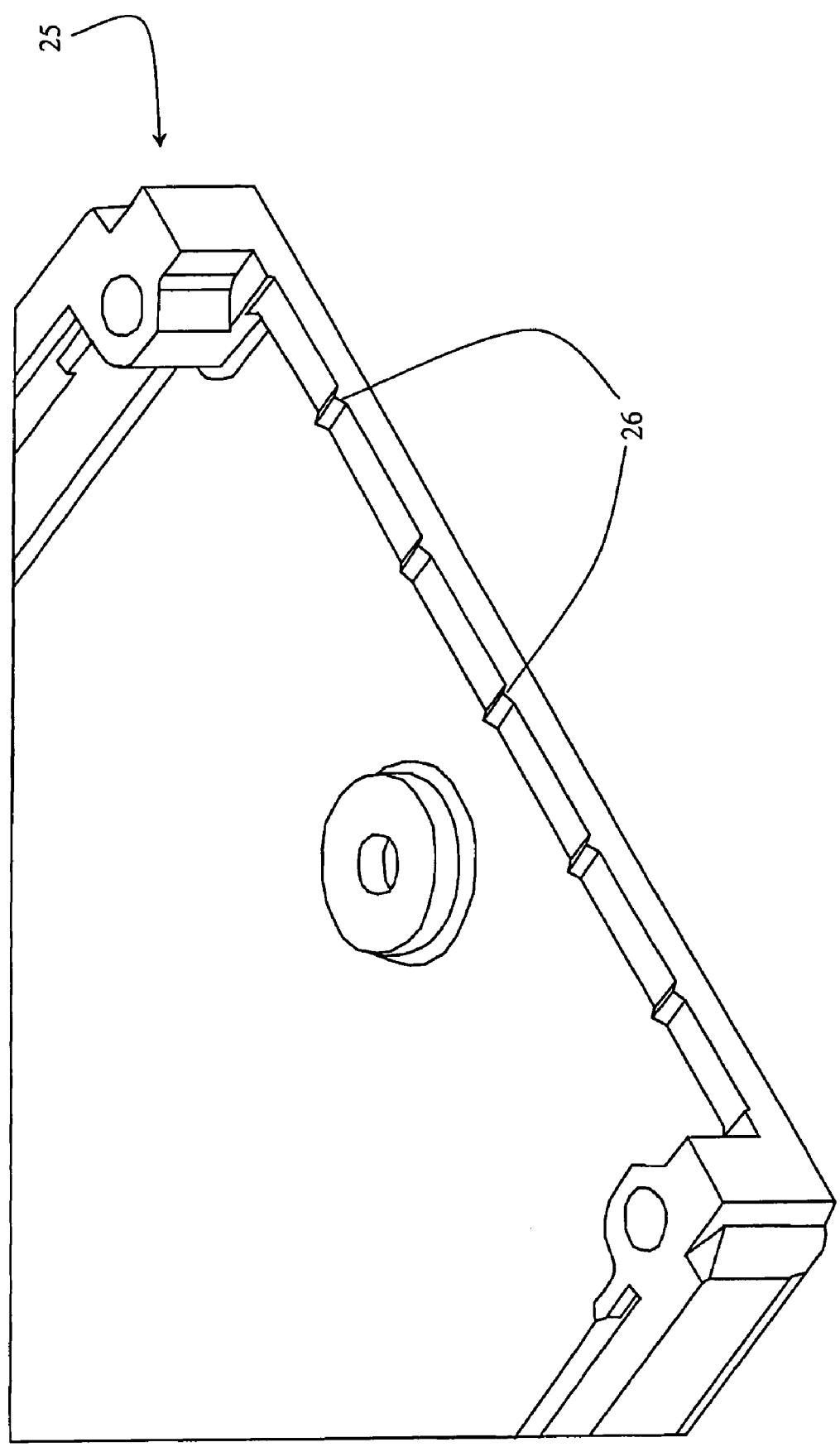

A housing bottom part 25 having a simpler configuration is shown in FIG. 5. In this embodiment ridges 26 are located along a side edge.

Figure 6:
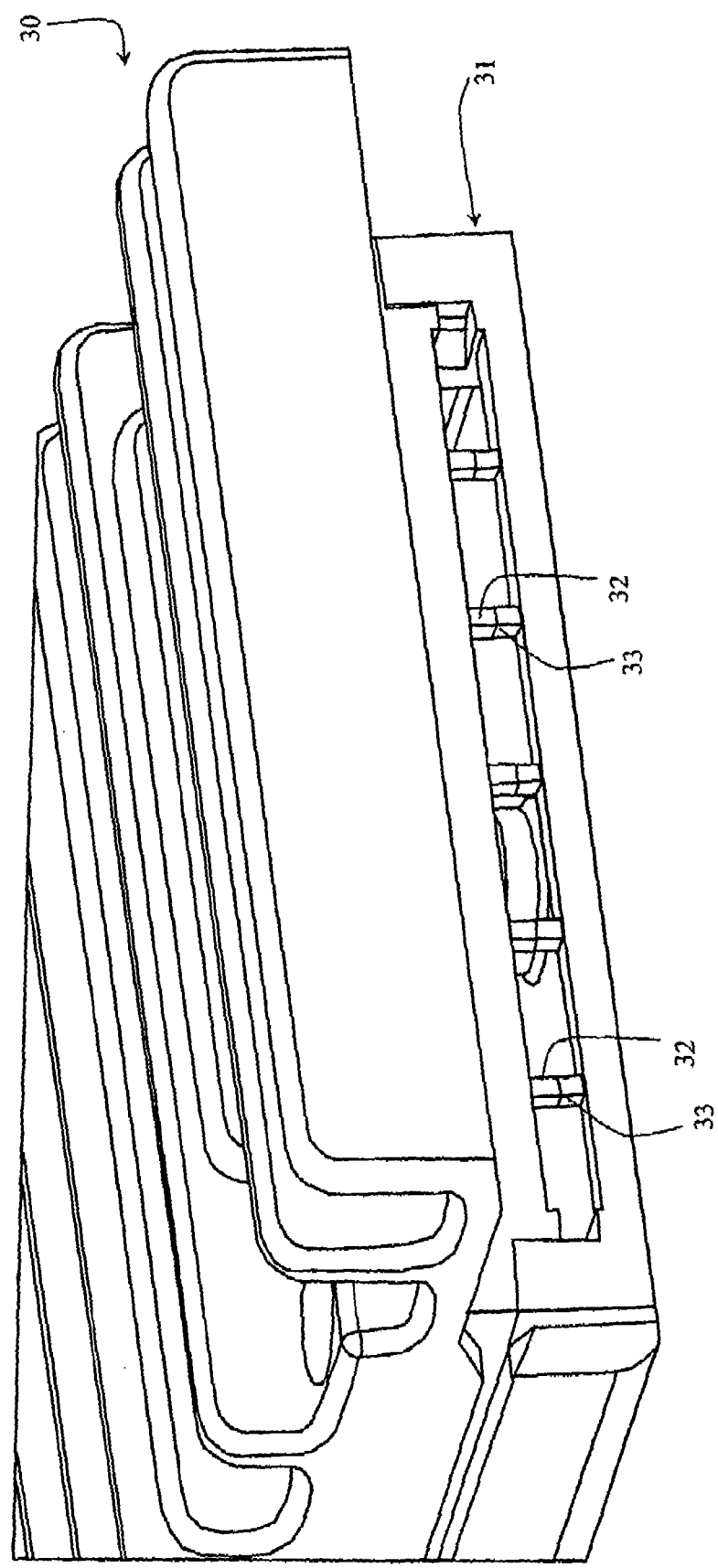
FIG. 6 is a perspective view showing the end of an alternative assembly.
Figure 7:
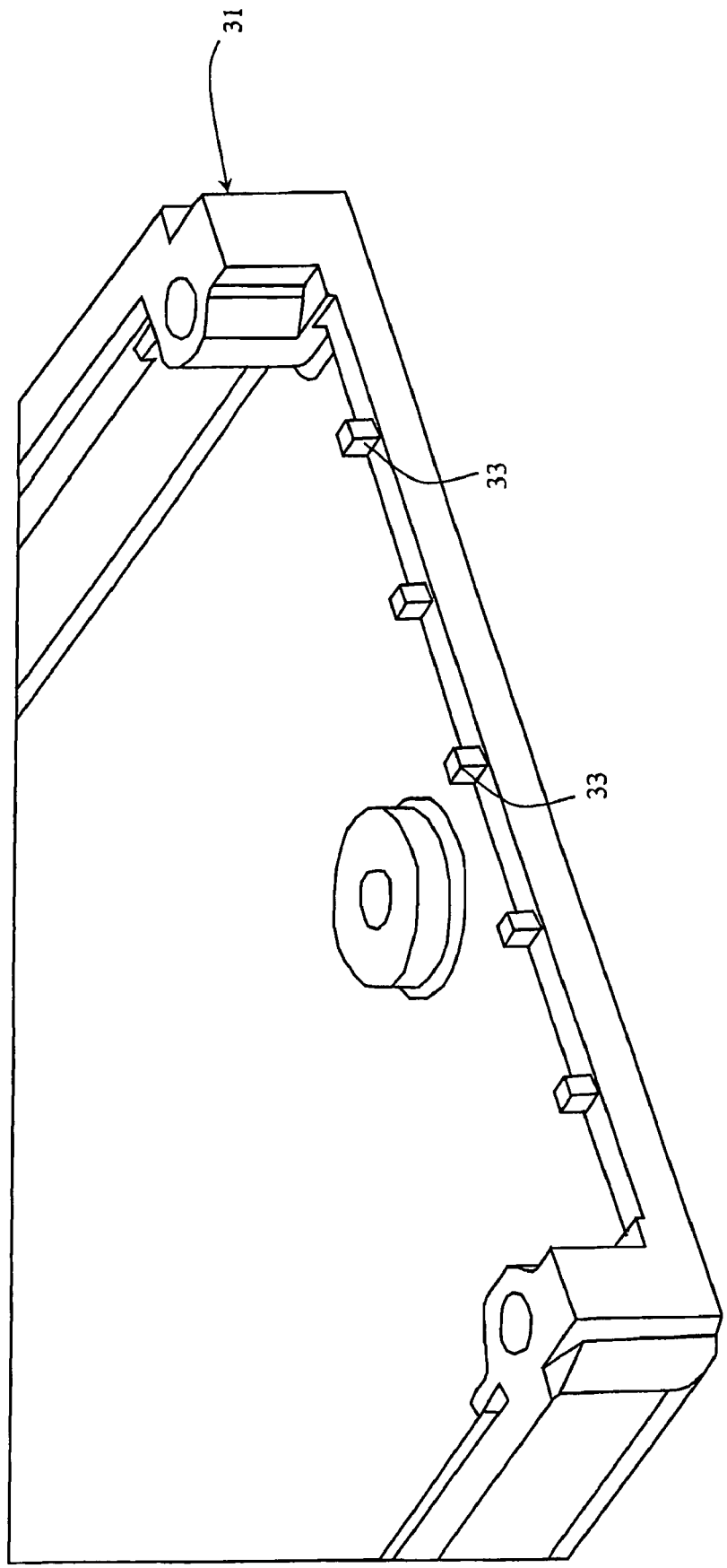
FIG. 7 shows a bottom housing part in more detail.

Referring to FIGS. 6 and 7 housing top and bottom parts 30 and 31 have metallised teeth 32 and 33 respectively which extend through apertures in the PCB to directly make physical and electrical contact. As the teeth 32 and 33 make contact there is no need for the apertures in the PCB to be filled or even plated.

Figure 8:
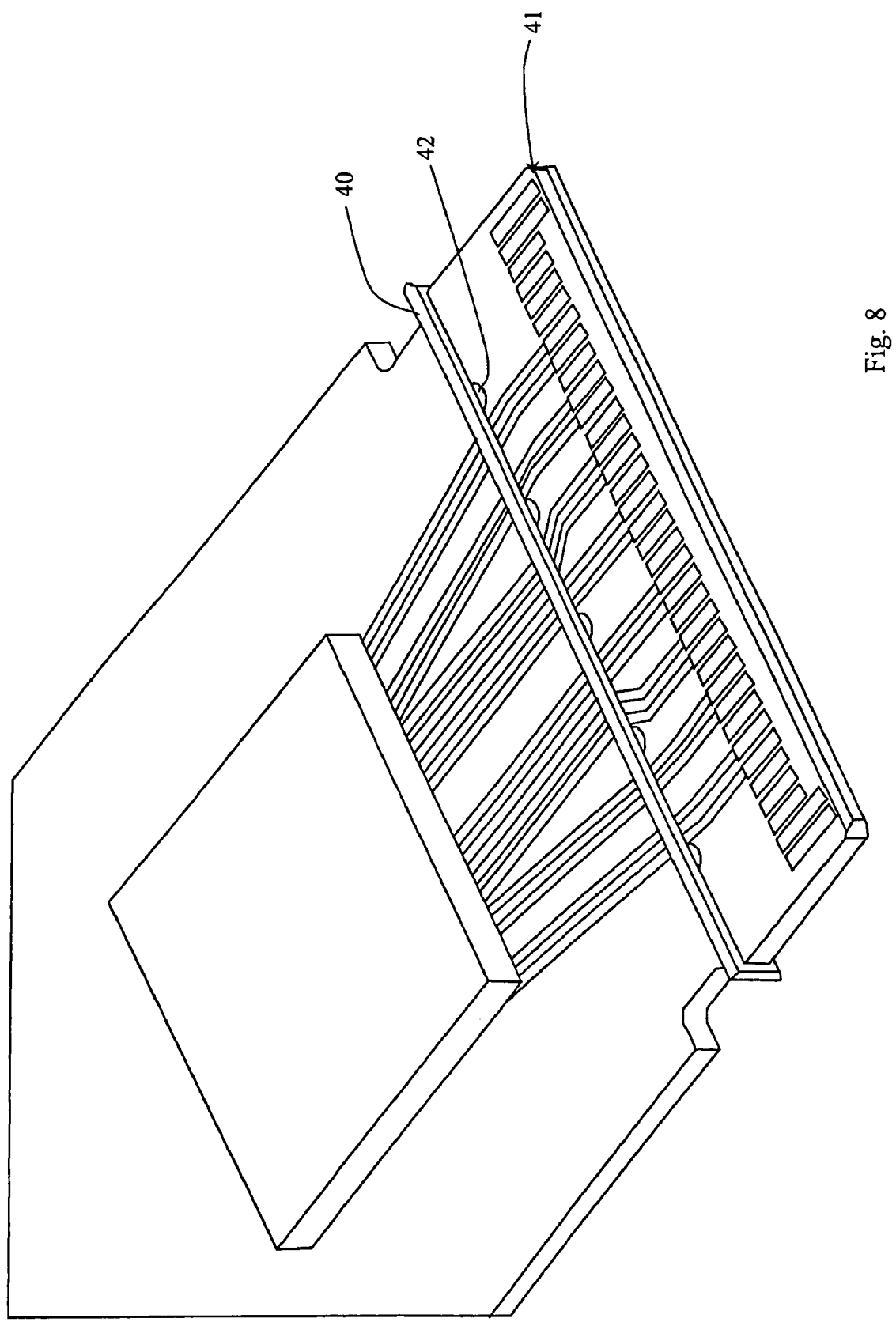
FIG. 8 shows a board and part of a housing of an alternative embodiment.

Referring to FIG. 8, in another embodiment the housing comprises a conductive EMC gasket 40 through which a PCB 41 is inserted. Only the gasket 40 is illustrated The PCB 41 has filled through-holes 42 for contact with the gasket 40. In this embodiment the gasket has a flat profile, however, it may be toothed.

The conductive elastomer fills the gap around the PCB and hence reduces the peripheral distance, and at the same time provides a cushion for the PCB to prevent mechanical damage. This, together with the through holes in the board provide the short peripheral distances.

Another advantage is that the elasticity of the seal means that there is some mechanical compliance in the arrangement to allow for some mechanical tolerance and to compensate for dimensional changes due to temperature changes.

The invention is not limited to the embodiments described but may be varied in construction and detail.

The invention claimed is:

1. An electronic device comprising a circuit board having high frequency tracks and a housing surrounding the board, wherein the housing and the board comprise interconnect means for forming electrical connections between opposed parts of the housing through the board, wherein the interconnect means comprises conductors extending through the board for contact with the housing on opposed sides of the board, and wherein the conductors comprise solder filled into board through-holes.

2. An electronic device as claimed in claim 1, wherein the conductors extend above the surface of the board on at least one side.

3. An electronic device as claimed in claim 2, wherein the conductors form bumps on both opposed surfaces of the board.

4. An electronic device as claimed in claim 1, wherein the housing comprises protruding features to make electrical connections with the conductors.

5. An electronic device as claimed in claim 4, wherein the protruding features are ridge-shaped.

6. An electronic device as claimed in claim 1, wherein the board comprises through-holes and the housing comprises teeth extending through the through holes.

7. An electronic device as claimed in claim 6, wherein opposed teeth extend partially through the through-holes to make contact.

8. An electronic device as claimed in claim 7, wherein the opposed teeth extend partially through the board.

9. An electronic device as claimed in claim 1, wherein the housing comprises a conductive and resilient connector that makes the contact with the conductors.

10. An electronic device as claimed in claim 9, wherein said connector is in the form of a gasket surrounding the board.

* * * * *